United States Patent [19]

Larner

[11] Patent Number: 5,391,931
[45] Date of Patent: Feb. 21, 1995

[54] PROTECTION OF INTEGRATED CIRCUIT DEVICES

[75] Inventor: David J. Larner, Lynsted, England

[73] Assignee: GEC-Marconi Limited, United Kingdom

[21] Appl. No.: 901,832

[22] Filed: Jun. 22, 1992

[30] Foreign Application Priority Data

Jul. 24, 1991 [GB] United Kingdom ............... 9115976

[51] Int. Cl.$^6$ ........................................... H03K 19/08
[52] U.S. Cl. ........................ 307/117; 361/54; 307/100; 257/921; 327/325; 327/509
[58] Field of Search .............. 307/100, 117, 542, 565, 307/568, 308; 361/54; 257/921; 323/349–351, 221

[56] References Cited

U.S. PATENT DOCUMENTS

| | | | |
|---|---|---|---|
| 3,886,379 | 5/1975 | Bickley et al. | 361/58 |
| 3,982,197 | 9/1976 | Schade, Jr. | 307/308 |
| 4,010,403 | 3/1977 | Ashley | 307/308 X |
| 4,037,140 | 7/1977 | Eaton, Jr. | 361/56 |
| 4,687,622 | 8/1987 | Longden | 376/254 |
| 4,695,937 | 9/1987 | Verity | 363/25 |
| 4,794,261 | 12/1988 | Rosen | 250/551 |
| 4,800,299 | 1/1989 | Hayward | 307/308 |
| 4,876,584 | 10/1989 | Taylor | 237/358 |
| 5,010,321 | 4/1991 | Larner et al. | 340/600 |
| 5,072,169 | 12/1991 | Saul et al. | 307/308 X |
| 5,103,283 | 4/1992 | Hite | 257/724 |

FOREIGN PATENT DOCUMENTS 2136648  9/1984  United Kingdom .
2202403  9/1988  United Kingdom .

OTHER PUBLICATIONS

IBM Technical Disclosure Bulletin, vol. 14, No. 4, Sep. 1971, p. 1233, "Radiation Modulated Conductivity Switch".
Patent Abstracts of Japan, vol. 9, No. 81, 59–214252, Apr. 10, 1985.
IBM Technical Disclosure Bulletin, vol. 28, No. 2, Jul. 1985, pp. 735–736, "Photoconductor detector and switch to protect integrated circuits from cosmic rays-induced damage".

Primary Examiner—A. D. Pellinen
Assistant Examiner—Fritz M. Fleming
Attorney, Agent, or Firm—Kirschstein et al.

[57] ABSTRACT

An arrangement for protecting an integrated circuit device (11) against latch up during a nuclear event comprising a capacitance (15) and a switch (17) connected in parallel across the power supply lines (13) of the device. When the power supply lines are connected to a power supply (19) the capacitance stores energy sufficient to supply necessary operating currents to the device during its normal operation. The switch is arranged so that, under a transient gamma pulse incident thereon during a nuclear event, its impedance is set to a low value at such a rate that the energy stored by the capacitance is discharged through the switch and the voltage applied to the device via the power supply lines is pulled down to such a level and at such a rate as to prevent transient gamma pulse induced latch-up in the device.

7 Claims, 2 Drawing Sheets

PROTECTION OF INTEGRATED CIRCUIT DEVICES

BACKGROUND OF THE INVENTION

1. Field of the Invention

This invention relates to the protection of integrated circuit (IC) devices against latch-up during a nuclear event.

2. Description of the Related Art

Latch-up occurs in an IC device when a transient gamma pulse arising at a nuclear event causes parasitic components within the device to become locked in a permanent state. This renders the IC device useless and may lead to its burn out.

A conventional method of preventing such latch-up is to arrange for the power supply of an equipment incorporating IC devices susceptible to such latch-up to be temporarily grounded via a so-called crow-bar switch which is closed in response to detection of a nuclear event by a detector specifically provided for the detection of such events.

Such a method has the disadvantages that the crow-bar switch has to become very rapidly capable of passing a large current and that the supply is interrupted not only to IC devices which require gamma induced latch-up protection, but also to other devices of an equipment.

SUMMARY OF THE INVENTION

It is an object of the present invention to provide a circuit incorporating IC devices wherein gamma induced latch-up protection is provided in such a way as to avoid these difficulties.

According to the present invention there is provided a circuit comprising at least one integrated circuit device; a pair of power supply lines for said device; a capacitance connected across said power supply lines which serves to reduce transients in the power supplied via said lines to said device in normal operation of the circuit; and connected across said capacitance a switch means whose impedance when a transient gamma pulse is incident thereon during a nuclear event is reduced to a low value at a rate such that the energy stored in the capacitance is discharged through the switch means and the voltage applied to the device via the power supply lines is pulled down to such a level and at such a rate as to prevent transient gamma pulse induced latch-up in the device.

Preferably the capacitance is constituted substantially wholly by the inherent capacitance arising from the structure of the switch means, but in other arrangements the capacitance is constituted partly by the inherent capacitance of the switch means and partly by a capacitor connected in parallel therewith.

BRIEF DESCRIPTION OF THE DRAWINGS

One circuit according to the invention and several variants thereof will now be described by way of example with reference to the accompanying drawings, in which:

FIG. 2b is a graph showing the required response of the circuit of FIG. 1 to the pulse of FIG. 2a;

DETAILED DESCRIPTION OF THE PREFERRED EMBODIMENTS

Figure 1:
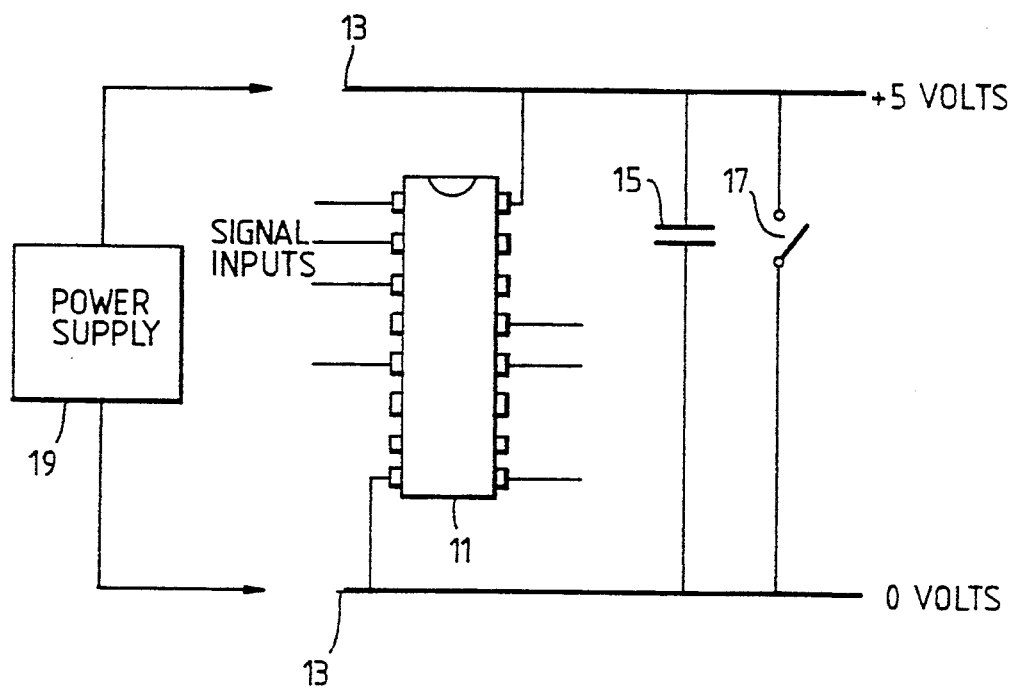
FIG. 1 is a schematic diagram of the circuit.

Referring to FIG. 1, the circuit essentially comprises: an integrated circuit (IC) device 11 connected between power supply lines 13; a capacitance 15 connected between the lines 13; and a switch means 17 connected in parallel with the capacitance 15.

The capacitance 15 is of such a value that when lines 13 are connected to a power supply 19, the energy stored by the capacitance 15 is sufficient to supply necessary operating currents to the IC device 11 during its normal operation. Thus the capacitance 15 is of sufficiently high value to prevent significant transients appearing in the voltage supply to the IC device 11 in normal operation.

The switch means 17 is so constructed that under a transient gamma pulse P incident thereon during a nuclear event, its impedance is set to a low value whereby the energy stored by the capacitance 15 is rapidly discharged through the switch means 17. The low impedance of the switch means is, moreover, such and the rate at which the low impedance of the switch means 15 is attained is such that the voltage applied to the lines 13 is pulled down to such a level and at such a rate as to prevent transient gamma pulse induced latch-up in the IC device 11.

Figure 2A:
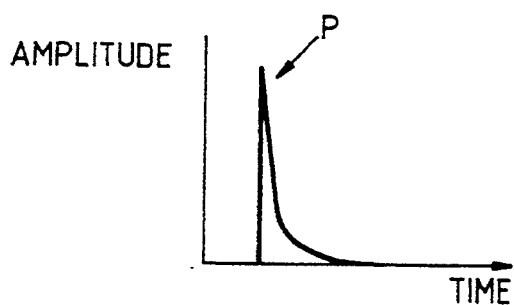
FIG. 2a is a graph illustrating a typical gamma pulse.
Figure 2B:
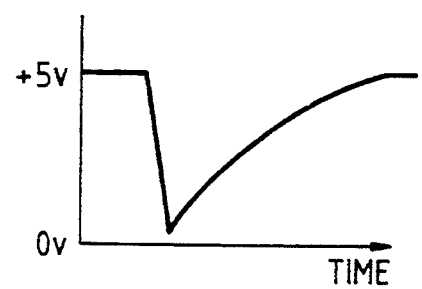

FIGS. 2a and 2b illustrate the gamma pulse P and the required consequent effect of the impedance drop of switch means 17 on the voltage across the capacitance 15 and hence the power lines 13. It will be appreciated that other IC devices (not shown) connected between the supply lines 13, if susceptible to latch-up, will be individually provided with their own capacitance and switch means for latch-up protection. Other devices, however, not susceptible to latch-up, will not be provided with such latch-up protection.

The switch means 17 is conveniently a semiconductor device such as a PIN diode. Typically such a diode, in its common implementations, will have a chip, i.e. inherent, capacitance of 320 pf. Experiment has shown, however, that for transient suppression a capacitance of around 2000 pF or more is called for. Accordingly the capacitance 15 and switch means 17 typically comprise a hybrid device, referred to for convenience as an active capacitor, comprising a capacitor 21 and a PIN diode 23 as shown in FIG. 3.

Figure 3:
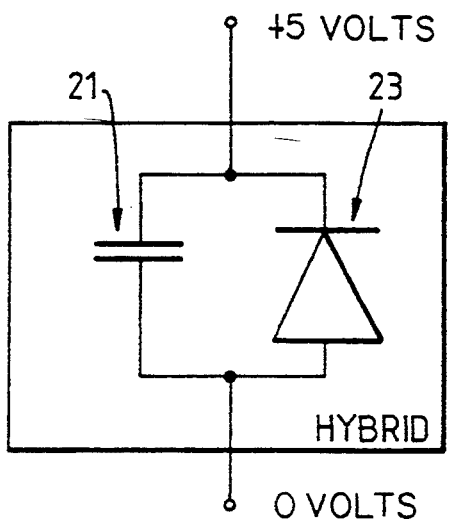
FIG. 3 illustrates one possible form of a switch means and capacitance of FIG. 1.
Figure 4:
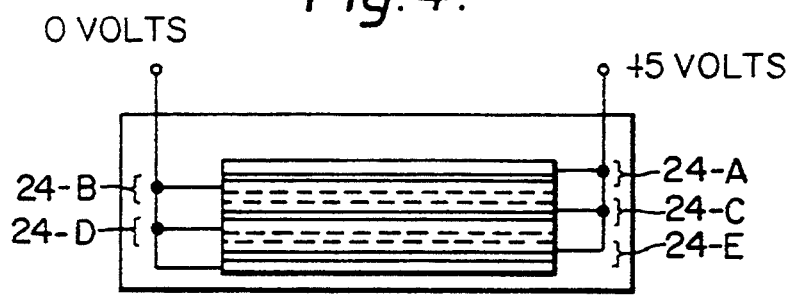
FIG. 4 illustrates an alternative form of the switch means and capacitance.
Figure 5:
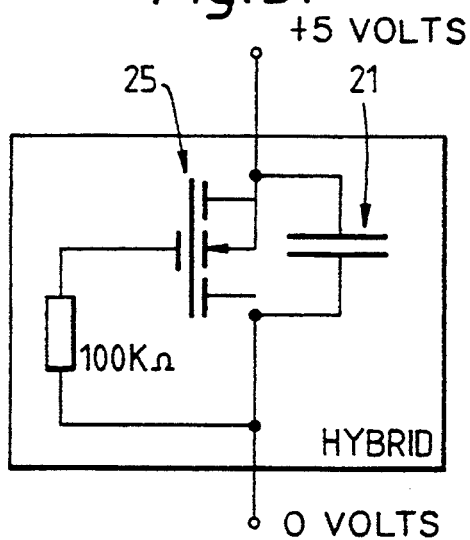
FIG. 5 illustrates a third possible form of the switch means and capacitance.

Preferably, however, an active capacitor in the form of a PIN diode stack comprising a multiplicity of PIN diodes connected in parallel, e.g., five diodes 24A, 24B, 24C, 24D and 24E, as shown in FIG. 4 is used providing not only the gamma pulse response necessary but possessing an inherent capacitance of the requisite value e.g. 2000 pF or more. An additional separate capacitor as shown in FIG. 3 is then not required.

Where a separate capacitor, as capacitor 21 of FIG. 3 is used, a switch means 17 other than a PIN diode may of course be employed, as shown in FIG. 5 where the switch means 17 is constituted by a MOS-FET device 25.

However the overall arrangement must be such that: the supply lines 13 are reduced to a low, e.g. ground potential; the speed of operation is sufficiently high to prevent latch-up; and the circuit, in particular the capacitance 15 and switch means 17, are able to survive a multiplicity of gamma pulses i.e. still maintain functionality after a nuclear event has occurred.

I claim:

1. A circuit comprising: at least one integrated circuit device; a pair of power supply lines for said device; a capacitance connected across said power supply lines which serves to reduce transients in the power supplied via said lines to said device in normal operation of the circuit; and connected across said capacitance and forming a unit therewith, a switch means whose impedance, when a transient gamma pulse is incident thereon during a nuclear event, is reduced to a low value at a rate such that the energy stored in the capacitance is discharged through the switch means and the voltage applied to the device via the power supply lines is pulled down to such a level and at such a rate as to prevent transient gamma pulse induced latch-up in the device.

2. A circuit according to claim 1 wherein said capacitance is constituted partly by the inherent capacitance of said switch means and partly by the capacitance of a capacitor connected in parallel with said switch means.

3. A circuit according to claim 2 wherein said switch means is a semiconductor device.

4. A circuit according to claim 3 wherein said switch means is a PIN diode device.

5. A circuit according to claim 1 wherein said capacitance is constituted substantially wholly by the inherent capacitance of said switch means.

6. A circuit according to claim 5 wherein said switch means is a PIN diode device.

7. A circuit according to claim I wherein said capacitance has a value of about 2000 pF or more.

* * * * *